(12) United States Patent
Chu

(10) Patent No.: US 11,387,770 B2
(45) Date of Patent: Jul. 12, 2022

(54) POWER DRIVING CHIP AND METHOD THEREOF

(71) Applicant: NUVOTON TECHNOLOGY CORPORATION, Hsinchu (TW)

(72) Inventor: Ping-Ying Chu, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 360 days.

(21) Appl. No.: 16/589,464

(22) Filed: Oct. 1, 2019

(65) Prior Publication Data

US 2020/0106382 A1  Apr. 2, 2020

(30) Foreign Application Priority Data

Oct. 2, 2018 (TW) .................. 107134748

(51) Int. Cl.
| | |
|---|---|
| *H02P 29/68* | (2016.01) |
| *H03K 17/0812* | (2006.01) |
| *H02H 5/04* | (2006.01) |
| *H03K 17/08* | (2006.01) |

(52) U.S. Cl.
CPC .............. *H02P 29/68* (2016.02); *H02H 5/04* (2013.01); *H03K 17/08122* (2013.01); *H03K 2017/0806* (2013.01)

(58) Field of Classification Search
CPC .. H02P 29/68; H02H 5/04; H03K 2017/0806; H03K 17/08122
See application file for complete search history.

(56) References Cited

U.S. PATENT DOCUMENTS

| | | | | |
|---|---|---|---|---|
| 9,553,529 | B2* | 1/2017 | Omura | H02P 6/085 |
| 2011/0249371 | A1* | 10/2011 | Jin | H02H 5/04 |
| | | | | 361/103 |
| 2016/0126192 | A1* | 5/2016 | Hohlfeld | H01L 23/5389 |
| | | | | 257/668 |
| 2016/0204073 | A1* | 7/2016 | Beak | H01L 23/291 |
| | | | | 455/418 |
| 2017/0244240 | A1* | 8/2017 | Watanabe | H03K 7/08 |
| 2020/0212839 | A1* | 7/2020 | Kawaguchi | H02M 1/00 |

FOREIGN PATENT DOCUMENTS

WO  WO-2020030341 A1 *  2/2020 .............. H02P 29/68

* cited by examiner

*Primary Examiner* — Harry R Behm
(74) *Attorney, Agent, or Firm* — Muncy, Geissler, Olds & Lowe, P.C.

(57) ABSTRACT

A power driving chip and method are disclosed. The power driving chip includes an integrated power module disposed in a package structure and including a transistor and a gate driver electrically connected to the transistor; a controller disposed in the package structure and electrically connected to the integrated power module; and a multi-level over-temperature protection circuit for measuring an inner temperature of the integrated power module. When the inner temperature exceeds a first trigger temperature, the multi-level over-temperature protection circuit triggers the controller to reduce the output power of the integrated power module. When the inner temperature exceeds a second trigger temperature, the multi-level overheating protection circuit triggers the controller to turn off the integrated power module. The second trigger temperature is higher than the first trigger temperature.

8 Claims, 6 Drawing Sheets

POWER DRIVING CHIP AND METHOD THEREOF

CROSS-REFERENCE TO RELATED APPLICATION

This application claims the benefit of Taiwan Patent Application No. 107134748, filed on Oct. 2, 2018, in the Taiwan Intellectual Property Office, the disclosure of which is incorporated herein in its entirety by reference.

BACKGROUND OF THE INVENTION

1. Field of the Invention

The present invention relates to a power driving chip and a method thereof, and more particularly to an over-temperature protection device for driving motor, and a method thereof.

2. Description of the Related Art

With the advancement of process technology, the size of the transistor is greatly reduced, and the number of transistors on the wafer of the same area is greatly increased; however, an unavoidable problem of increased heat generation of the wafer also occurs. At a high temperature, the switching speeds, reliabilities and lifetimes of the integrated-circuit components are possibly affected. Since some integrated circuit chips, such as microprocessor, generate a lot of heat during operation, an external heat dissipation system is required to solve this problem.

In application field of power transistors, channel resistance is often increased by temperature rise, and it also causes more power loss of the PN junctions in the integrated-circuit components. When the external heat dissipation system is unable to keep the temperature of the power transistor at a safe level, it is very likely that the power transistors possibly occur thermal runaway.

SUMMARY OF THE INVENTION

An objective of the present invention is to provide a power driving chip and a method thereof, to solve conventional problems.

In order to achieve the objective, the present invention provides a power driving chip comprising an integrated power module, a controller, and a multi-level over-temperature protection circuit. The integrated power module is disposed in a package structure, and comprises a transistor, and a gate driver electrically connected to the transistor. The controller is disposed in the package structure and electrically connected to the integrated power module, and configured to control the integrated power module. The multi-level over-temperature protection circuit is disposed in the integrated power module, and configured to measure an inner temperature of the integrated power module. When the inner temperature exceeds a first trigger temperature, the multi-level over-temperature protection circuit generates a load-shedding driving signal to the controller, and the controller decreases output power of the integrated power module according to the load-shedding driving signal. When the inner temperature exceeds a second trigger temperature, the multi-level over-temperature protection circuit generates an overloading driving signal to the controller, and the controller turns off the integrated power module according to the overloading driving signal. The second trigger temperature is higher than the first trigger temperature, and the controller is stacked on the integrated power module in the package structure.

In order to achieve the objective, the present invention provides a power driving chip comprising an integrated power module, a controller, and a multi-level over-temperature protection circuit. The integrated power module is disposed in a package structure, and comprises a transistor, and a gate driver electrically connected to the transistor. The controller is disposed in the package structure and electrically connected to the integrated power module. The multi-level over-temperature protection circuit is disposed in the controller, and configured to measure an inner temperature of the controller. When the inner temperature exceeds the first trigger temperature, the multi-level over-temperature protection circuit generates a load-shedding driving signal to the controller, and the controller decreases the output power of the integrated power module according to the load-shedding driving signal. When the inner temperature exceeds the second trigger temperature, the multi-level over-temperature protection circuit generates an overloading driving signal to the controller, and the controller turns off the integrated power module according to the overloading driving signal. The second trigger temperature is higher than the first trigger temperature, and the controller is stacked on the integrated power module in the package structure.

Preferably, when the inner temperature is lower than a re-driving temperature, the multi-level over-temperature protection circuit generates a re-driving signal to the controller, and the controller increases the output power of the integrated power module according to the re-driving signal.

Preferably, the controller reduces at least one of a driving voltage and a driving current of the integrated power module according to the load-shedding driving signal, to decrease the output power of the integrated power module.

Preferably, the controller reduces a duty cycle of a PWM driving signal of the integrated power module to decrease the output power of the integrated power module according to the load-shedding driving signal.

Preferably, the second trigger temperature is a maximum withstand temperature of the integrated power module, and the first trigger temperature is a maximum withstand temperature of the controller.

In order to achieve the objective, the present invention provides a power driving method comprising steps of: disposing an integrated power module in a package structure, wherein the integrated power module comprises a transistor, and a gate driver electrically connected to the transistor; disposing a controller in a package structure, and electrically connecting the controller to the integrated power module; disposing a multi-level over-temperature protection circuit in the integrated power module to measure the inner temperature of the integrated power module; setting a first trigger temperature of the multi-level over-temperature protection circuit, wherein when the inner temperature exceeds the first trigger temperature, the multi-level over-temperature protection circuit generates a load-shedding driving signal to the controller, the controller decreases output power of the integrated power module according to the load-shedding driving signal; and setting a second trigger temperature of the multi-level over-temperature protection circuit, wherein when the inner temperature exceeds the second trigger temperature, the multi-level over-temperature protection circuit generates an overloading driving signal to the controller, and the controller turns off the integrated power module according to the overloading driving signal; wherein the second trigger temperature is higher than the first trigger temperature, and the controller is stacked on the integrated power module in the package structure.

In order to achieve the objective, the present invention provides a power driving method, adapted to drive a motor, and the power driving method comprising steps of: disposing an integrated power module in a package structure, wherein the integrated power module comprises a transistor, and a gate driver electrically connected to the transistor; disposing a controller in a package structure, and electrically connecting the controller to the integrated power module; disposing a multi-level over-temperature protection circuit in a controller to measure an inner temperature of the controller; setting a first trigger temperature of the multi-level over-temperature protection circuit, wherein when the inner temperature exceeds the first trigger temperature, the multi-level over-temperature protection circuit generates a load-shedding driving signal to the controller, and the controller decreases output power of the integrated power module according to the load-shedding driving signal; and setting a second trigger temperature of the multi-level over-temperature protection circuit, wherein when the inner temperature exceeds the second trigger temperature, the multi-level over-temperature protection circuit generates an overloading driving signal to the controller, and the controller turns off the integrated power module according to the overloading driving signal, wherein the second trigger temperature is higher than the first trigger temperature.

Preferably, the power driving method further comprises a step of setting a re-driving temperature of the multi-level over-temperature protection circuit, wherein when the inner temperature is lower than the re-driving temperature, the multi-level over-temperature protection circuit generates a re-driving signal to the controller, and the controller increases the output power of the integrated power module according to the re-driving signal.

Preferably, the controller reduces at least one of a driving voltage and a driving current of the integrated power module according to the load-shedding driving signal, to decrease the output power of the integrated power module.

Preferably, the controller reduces a duty cycle of a PWM driving signal of the integrated power module according to the load-shedding driving signal, to decrease the output power of the integrated power module.

In the power driving chip and method of the present invention, the over-temperature protection circuit is disposed in the power module having a transistor, or disposed in the controller to monitor the inner temperature of the power driving chip, so that the over-temperature protection circuit can quickly measure the temperature caused by the transistor or the controller. Furthermore, the over-temperature protection circuit of the present invention can perform over-temperature protection for the power driving chip by a multi-level monitoring manner, so as to effectively prevent the power transistor from losing thermal control.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
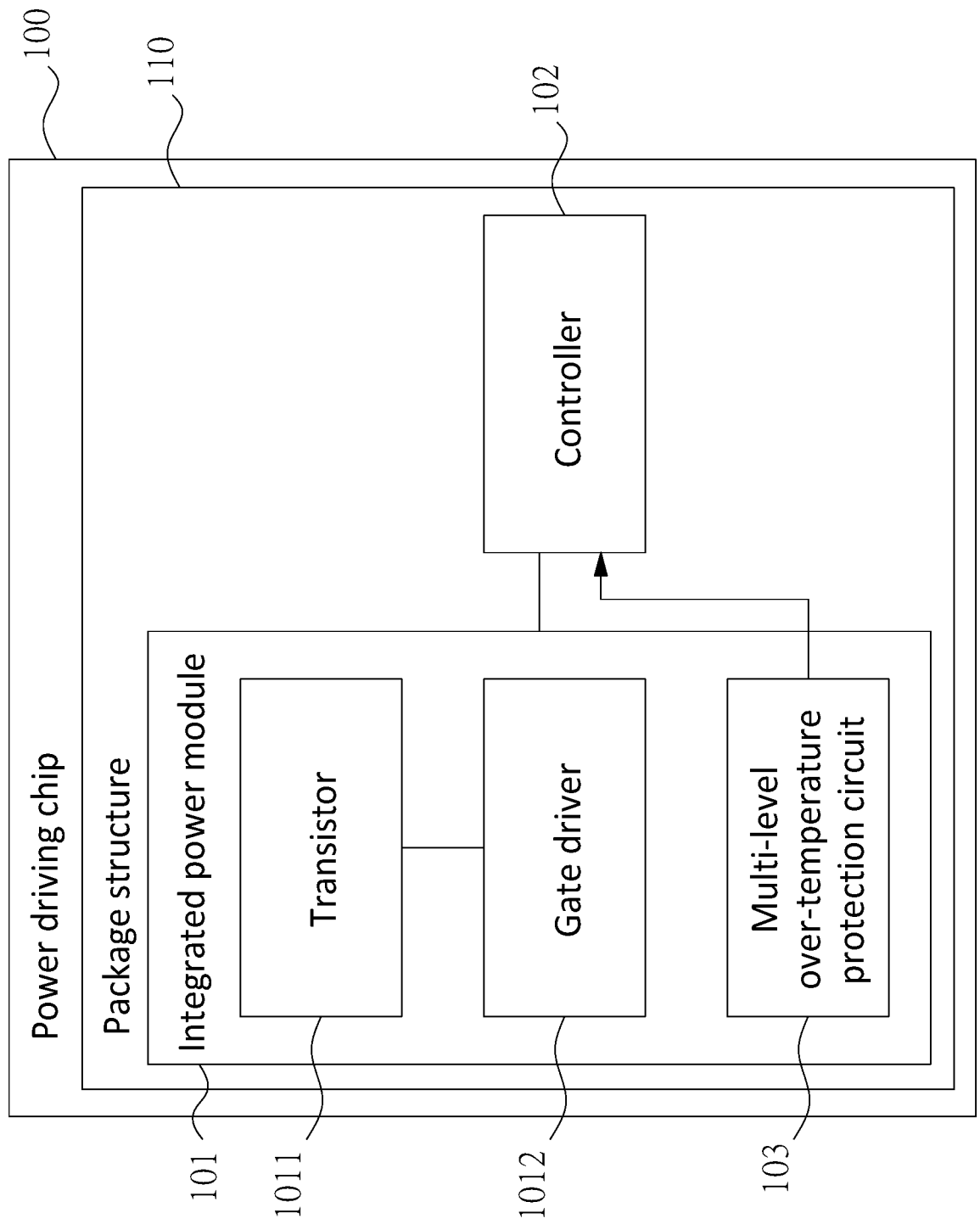
FIG. 1 is a block diagram of a power driving chip according to one embodiment of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 3:
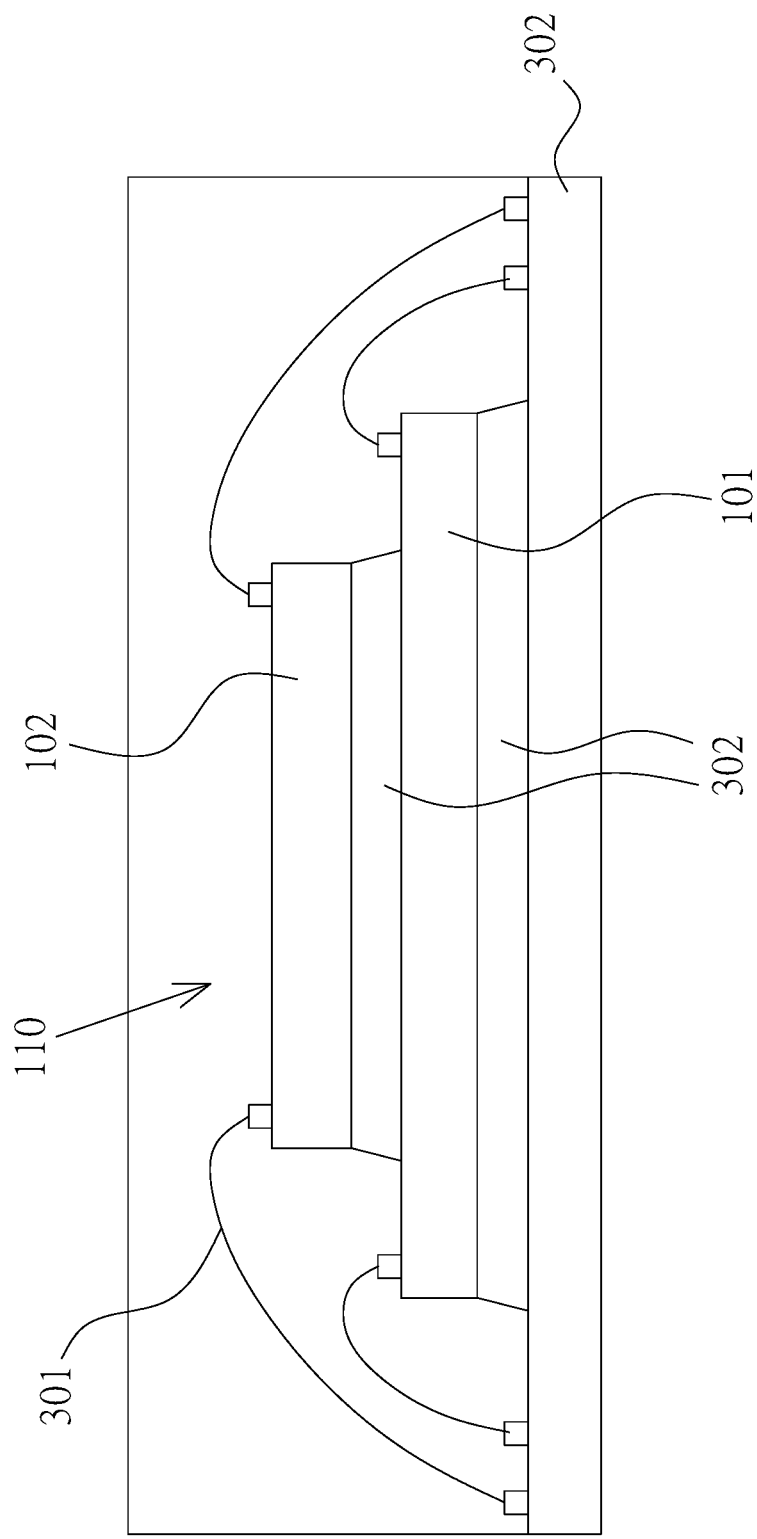
FIG. 3 is a horizontally sectional view of a power driving chip according to one embodiment of the present invention.

Please refer to FIGS. 1 and 3. FIG. 1 is a block diagram of a power driving chip according to one embodiment of the present invention, and FIG. 3 is a schematic view of a power driving chip according to one embodiment of the present invention. The power driving chip 100 is configured to drive a motor, and comprises an integrated power module 101, a controller 102 and a multi-level over-temperature protection circuit 103. The integrated power module 101 is disposed inside a package structure 110 and comprises a transistor 1011, and a gate driver 1012 electrically connected to the transistor 1011. The controller 102 is disposed inside the package structure 110 and electrically connected to the integrated power module 101. The integrated power module 101 is electrically connected to the controller 102, and the controller 102 is configured to control the operation of the integrated power module 101. For example, the integrated power module 101 can comprise at least one pin electrically connected to at least one pin of the controller 102.

The multi-level over-temperature protection circuit 103 is disposed inside the integrated power module 101, and configured to measure an inner temperature of the integrated power module 101. When the inner temperature of the integrated power module 101 exceeds a first trigger temperature $T_{t1}$, the multi-level over-temperature protection circuit 103 generates and transmit a load-shedding driving signal to the controller 102, and the controller 102 can control the integrated power module 101 according to the load-shedding driving signal, so as to decrease the output power. When the inner temperature of the integrated power module 101 exceeds the second trigger temperature $T_{t2}$, the multi-level over-temperature protection circuit 103 can generate an overloading driving signal to the controller 102, and the controller 102 can turn off the integrated power module 101 according to the overloading driving signal. The second trigger temperature $T_{t2}$ is higher than the first trigger temperature $T_{t1}$. In an embodiment, the second trigger temperature $T_{t2}$ is the maximum withstand temperature of the integrated power module 101, and the first trigger temperature $T_{t1}$ is the maximum withstand temperature of the controller 102.

In order to ensure operation of the circuit, normal, the chip has a high-temperature protection mechanism. When the inner temperature of the chip is higher than a preset temperature threshold value, the high-temperature protection mechanism slows or stops the operation of the chip, so as to lower the inner temperature of the chip to prevent the circuits of the chip from being damaged permanently by high temperature. The preset temperature threshold value of the controller 102 is lower than the preset temperature threshold value of the integrated power module 101. Since the function of the integrated power module 101 is to output a high current to an external load, the circuits of the integrated power module 101 is designed to withstand higher temperature; in contrast, since the function of the controller 102 is to perform logic computation, the circuit of the controller 102 is generally not in consideration of withstanding too high temperature. Furthermore, in conventional circuit, the controller 102 is more remote from the integrated power module 101, so the controller 102 is not designed to have high withstand temperature.

However, in order to decrease the size of the packaged chip of the present invention, the controller 102 is disposed adjacent to the integrated power module 101, and it indicates that the temperature generated by the integrated power module 101 can directly conduct to the controller 102, and it causes that the controller 102 possibly stops operating and the integrated power module 101 also stops operating under a specific temperature which is lower than the preset temperature threshold value (such as the second trigger temperature $T_{t2}$) of the integrated power module 101 and higher than the preset temperature threshold value (such as the first trigger temperature $T_{t1}$) of the controller 102. As a result, when the controller 102 and the integrated power module 101 are disposed in the same package structure, the integrated power module 101 possibly cannot perform the maximal efficiency thereof.

In order to solve aforementioned problem, the present invention provides the solution in which when the inner temperature of the integrated power module 101 exceeds the preset temperature threshold value (such as the first trigger temperature Tt1) of the controller 102, the multi-level over-temperature protection circuit 103 generates and transmit the load-shedding driving signal to the controller 102, and the controller 102 can control the integrated power module 101 according to the load-shedding driving signal, to decrease the output power. Under a condition that the inner temperature of the integrated power module 101 can conduct to the controller 102 through a pin or a conductive line, and in order to prevent the situation in which the controller 102 stops operating for self-protection and it also causes the integrated power module 101 to stop operating, the multi-level over-temperature protection circuit 103 of the present invention transmits the load-shedding driving signal to the controller 102, to enable the integrated power module 101 to reduce the output power for lowering the temperature thereof, so that the inner temperature of the controller 102 can be lowered, thereby keeping operation of the integrated power module 101.

When the inner temperature of the integrated power module 101 exceeds the preset temperature threshold value (such as, the second trigger temperature $T_{t2}$) of the integrated power module 101, the multi-level over-temperature protection circuit 103 can generate the overloading driving signal to the controller 102, and the controller 102 can turn off the integrated power module 10 according to the overloading driving signal. When the inner temperature of the integrated power module 101 rises continuously to exceed the second trigger temperature $T_{t2}$, it indicates that the decreasing of the output power is unable to decrease the inner temperature of the integrated power module 101, and short-circuit possibly occurs to cause a transient high current, and the circuit is possibly damaged permanently, so the controller 102 turns off the integrated power module 101 according to the overloading driving signal.

FIG. 3 is a schematic view of a power driving chip according to one embodiment of the present invention. As shown in FIG. 3, the integrated power module 101 and the controller 102 are disposed in the same package structure 110, and stacked longitudinally with each other, but the present invention is not limited thereto; in an embodiment, the integrated power module 101 and the controller 102 can be horizontally disposed in the same package structure, and the transistor 1011 can be, for example, a metal-oxide-semiconductor field-effect transistor (MOSFET).

Figure 2:
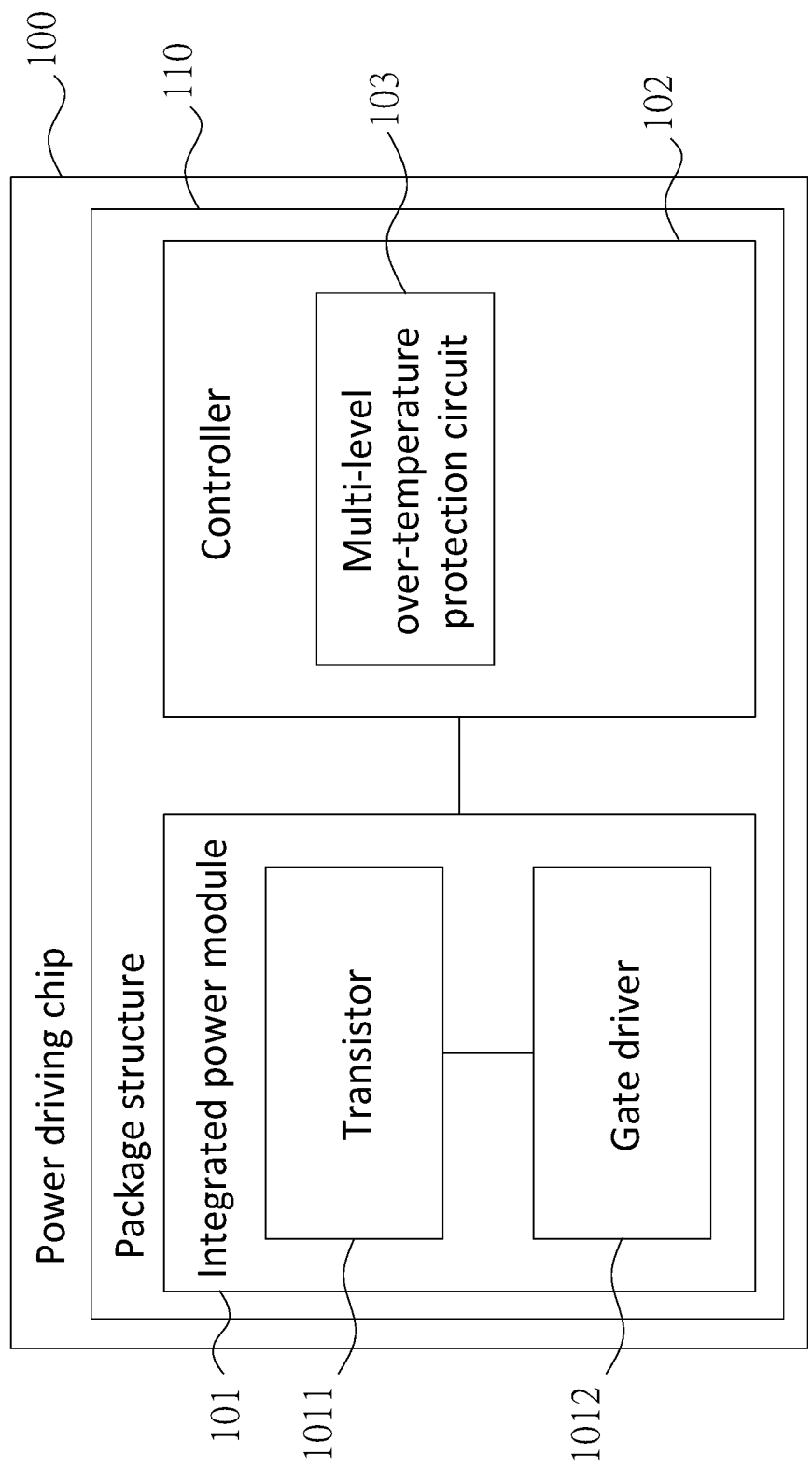
FIG. 2 is a block diagram of a power driving chip according to one embodiment of the present invention.

Please also refer to FIG. 2, which is a block diagram of a power driving chip according to one embodiment of the present invention. The difference between the embodiment shown in FIG. 2 and the embodiment shown in FIG. 1 is that the multi-level over-temperature protection circuit 103 of the embodiment shown in FIG. 2 is disposed inside the controller 102 to measure the inner temperature of the controller 102, and the controller 102 controls the output power of the integrated power module 101 according to the inner temperature of the controller 102. When the multi-level over-temperature protection circuit 103 measures the inner temperature of the controller 102 being higher than the first trigger temperature Tt1, the high temperature is possibly caused by the integrated power module 10, so the multi-level over-temperature protection circuit 103 can generate the load-shedding driving signal first, and the controller 102 controls the integrated power module 101 according to the load-shedding driving signal, to decrease the output power, thereby lowering the inner temperature of the integrated power module 101, and lowering the inner temperature of the controller 102, and keeping continuous operation of the integrated power module 101.

When the inner temperature of the integrated power module 101 exceeds the preset temperature threshold value (such as the second trigger temperature $T_{t2}$) of the integrated power module 101, the multi-level over-temperature protection circuit 103 can generate the overloading driving signal to the controller 102, and the controller 102 can turns off the integrated power module 101 according to the overloading driving signal. However, when the inner temperature of the integrated power module 101 rises continuously to exceed the second trigger temperature $T_{t2}$, it indicates that decreasing of the output power is unable to lower the inner temperature of the integrated power module 101, and short-circuit possibly occurs to cause a transient high current, and the circuit is possibly damaged permanently, so the controller 102 turns off the integrated power module 101 according to the overloading driving signal.

With advance of process technology, the size of the transistor is significantly reduced, the number of the transistors on the chip with the same area is also greatly increased, for example, when the integrated power module 101 and the controller 102 are disposed in the same package structure 110, the technical feature of the present invention is to solve the over-temperature problem caused by the integrated power module 101 and the controller 102. In an embodiment, the multi-level over-temperature protection circuit 103 can be disposed in the integrated power module 101, as shown in FIG. 1; alternatively, in another embodiment, the controller 102 can be disposed in the controller 102, as shown in FIG. 2.

Figure 4:
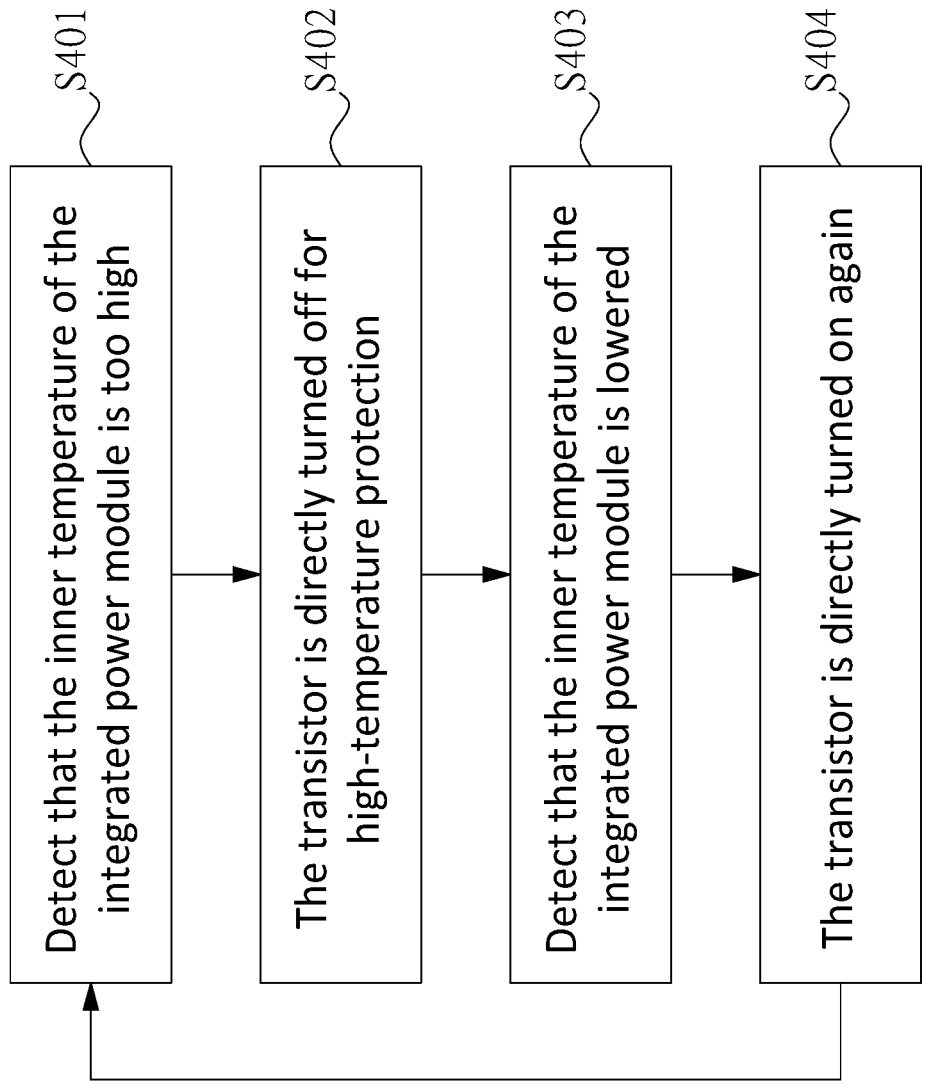
FIG. 4 is a flowchart showing the steps in an operation of a conventional over-temperature protection.
Figure 5:
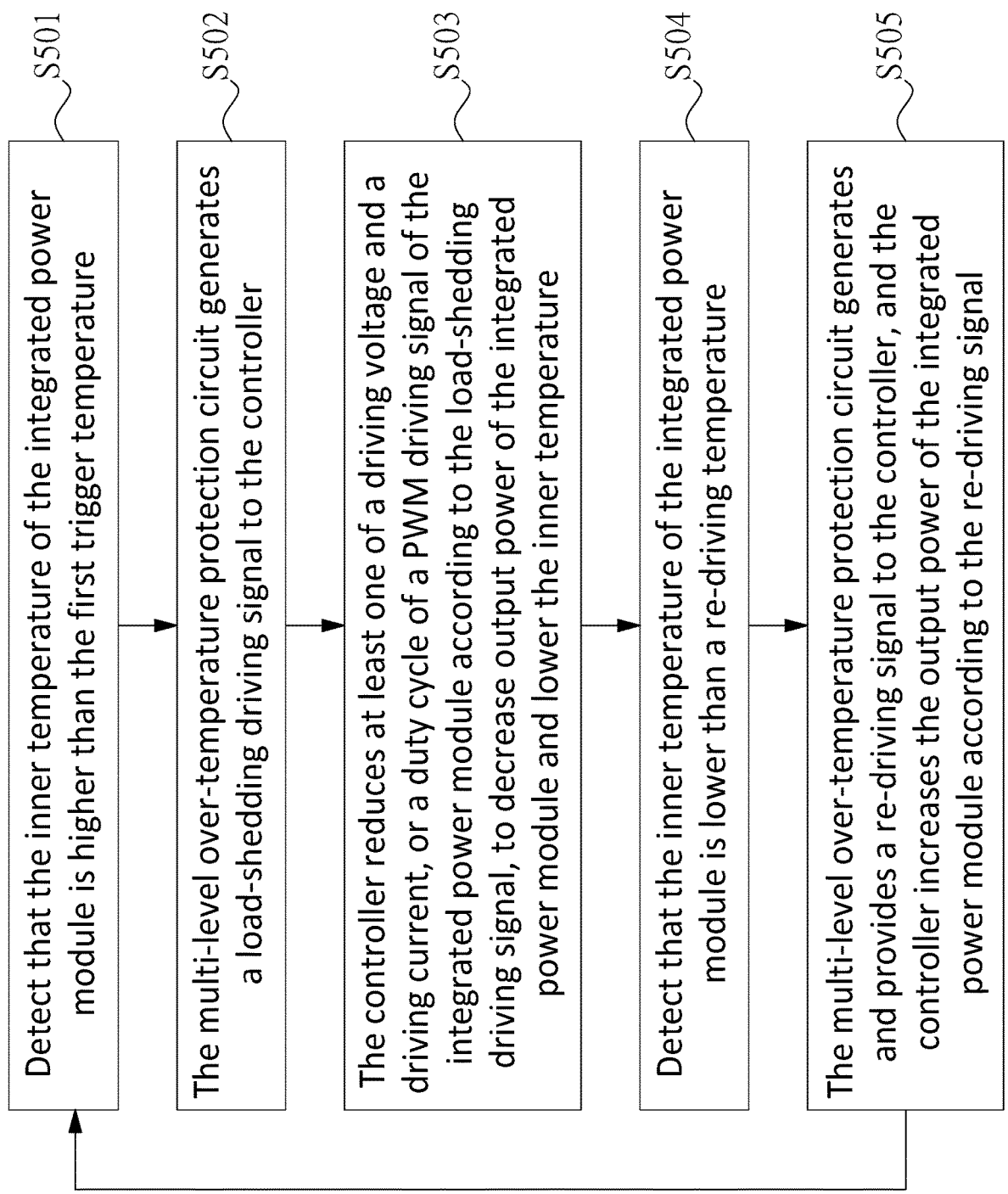
FIG. 5 is a flowchart showing the steps in an operation of a multi-level over-temperature protection mechanism according to one embodiment of the present invention.

Please refer to FIGS. 4 and 5. FIG. 4 is a flowchart showing the steps in an operation of a conventional over-temperature protection, and FIG. 5 is a flowchart showing the steps in an operation of a multi-level over-temperature protection mechanism according to one embodiment of the present invention. As shown in FIG. 4, the conventional method includes steps S401 to S404. In a step S401, when it is detected that the inner temperature of the integrated power module is too high, the transistor is directly turned off for high-temperature protection in a step S402; and in a step S403, when it is detected that the inner temperature of the integrated power module is lowered, the transistor is directly turned on again in a step S404. As shown in FIG. 5, the multi-level over-temperature protection of the present invention provides a lower temperature trigger point for over-temperature protection, such as the first trigger temperature Tt1 shown in FIG. 5.

Please refer to FIGS. 1 and 5. As shown in FIG. 5, the multi-level over-temperature protection mechanism of the present invention includes steps S501 to S505. In a step S501, when it is detected that the inner temperature of the integrated power module 101 is higher than the first trigger temperature Tt1, the multi-level over-temperature protection circuit generates a load-shedding driving signal to the controller in a step S502, and the controller reduces at least one of a driving voltage and a driving current, or a duty cycle of a PWM driving signal of the integrated power module according to the load-shedding driving signal in a step S503, to decrease output power of the integrated power module and lower the inner temperature of the integrated power module 101, so as to prevent the temperature of the system from continuously rising to the second trigger temperature $T_{t2}$ to force the motor to turn off. More specifically, when the inner temperature of the integrated power module 101 is higher than the first trigger temperature $T_{t1}$, the multi-level over-temperature protection circuit 103 generates the load-shedding driving signal to the controller 102, and the controller 102 can reduce a duty cycle of a PWM driving signal of the integrated power module 101 according to the load-shedding driving signal, or reduce at least one of the driving voltage and a driving current of the integrated power module 101, or reduce the speed of the motor, so as to decrease the output power of the integrated power module 101 for lowering the inner temperature of the integrated power module 101. In a step S504, after it is detected that the inner temperature of the integrated power module 101 is lowered to a re-driving temperature because of the output power adjustment, the multi-level over-temperature protection circuit 103 can generate and provide a re-driving signal to the controller 102, and the controller 102 can increase the output power of the integrated power module 101 according to the re-driving signal, in a step S505. Preferably, the re-driving temperature can be lower than the first trigger temperature $T_{t1}$.

The multi-level over-temperature protection mechanism of the present invention can be applied to some systems. For example, in a condition that the conventional over-temperature protection mechanism is applied to the remote-controlled aero-model, if the motor of the remote-controlled aero-model occurs over-temperature and the power supply is directly turned off, the remote-controlled aero-model directly loses flight control to crash; in contrast, when the multi-level over-temperature protection mechanism of the present invention is applied to the remote-controlled aero-model, and perform temperature control by multi-level mechanism, the revolving speed of the motor can be reduced first, so the remote-controlled aero-model can continuously fly or emergently land in a controllable range, to prevent lose flight control to crash.

Figure 6:
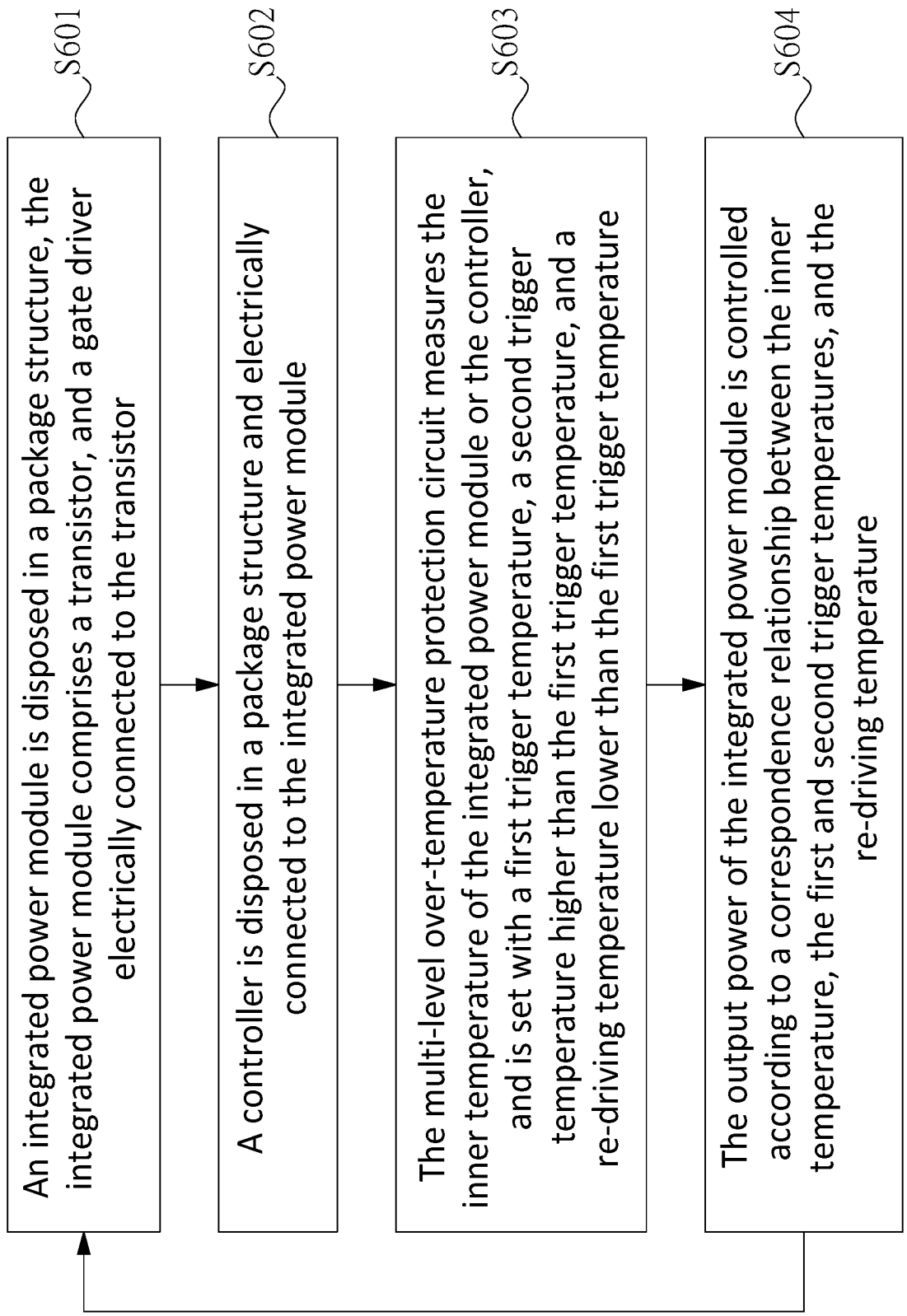
FIG. 6 is a flowchart showing the steps in an operation of a power driving method according to one embodiment of the present invention.

Please refer to FIG. 6, which is a power driving method according to the present invention. As shown in FIG. 6, the power driving method comprises steps S601 to S604. In a step S601, an integrated power module 101 is disposed in a package structure 110, the integrated power module 101 comprises a transistor 1011, and a gate driver 1012 electrically connected to the transistor 1011. In a step S602, a controller 102 is disposed in a package structure 110 and electrically connected to the integrated power module 101. In a step S603, the multi-level over-temperature protection circuit 103 is disposed in the integrated power module 101 or the controller 102, and configured to measure the inner temperature of the integrated power module 101 or the controller 102. The multi-level over-temperature protection circuit 103 is set with a first trigger temperature $T_{t1}$, a second trigger temperature $T_{t2}$ higher than the first trigger temperature $T_{t1}$, and a re-driving temperature lower than the first trigger temperature $T_{t1}$. In a step S604, the output power of the integrated power module 101 is controlled according to a correspondence relationship between the inner temperature, the first trigger temperature Tt1, the second trigger temperature Tt2 and the re-driving temperature. When the inner temperature exceeds the first trigger temperature Tt1, the multi-level over-temperature protection circuit 103 generates a load-shedding driving signal to the controller 102, and the controller 102 can decrease the output power of the integrated power module 101 according to the load-shedding driving signal; when the inner temperature exceeds the second trigger temperature Tt2, the multi-level over-temperature protection circuit 103 can generate an overloading driving signal to the controller 102, and the controller 102 turns off the integrated power module according to the overloading driving signal; and when the inner temperature is lower than the re-driving temperature, the multi-level over-temperature protection circuit 103 generates and transmits the re-driving signal to the controller 102, and the controller 102 increases the output power of the integrated power module according to the re-driving signal.

According to aforementioned descriptions, the over-temperature protection circuit of the present invention can be disposed in the integrated power module having the power transistor, or in the controller, thereby monitoring the inner temperature of the power driving chip, so that the over-temperature protection circuit can quickly measure the temperature caused by the power transistor or the controller. Furthermore, the over-temperature protection circuit of the present invention can perform over-temperature protection for the power driving chip by a multi-level monitoring manner, thereby effectively preventing the power transistor from losing thermal control.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A power driving chip, comprising:
an integrated power module disposed in a package structure, and comprising a transistor, and a gate driver electrically connected to the transistor;
a controller disposed in the package structure and electrically connected to the integrated power module; and
a multi-level over-temperature protection circuit disposed in the controller, and configured to measure an inner temperature of the controller, and when the inner temperature exceeds the first trigger temperature, the multi-level over-temperature protection circuit generates a load-shedding driving signal to the controller, and the controller decreases the output power of the integrated power module according to the load-shedding driving signal, and when the inner temperature exceeds the second trigger temperature, the multi-level over-temperature protection circuit generates an overloading driving signal to the controller, and the controller turns off the integrated power module according to the overloading driving signal;
wherein the second trigger temperature is higher than the first trigger temperature, and the second trigger temperature is a maximum withstand temperature of the integrated power module, and the first trigger temperature is a maximum withstand temperature of the controller, and the controller is stacked on the integrated power module in the package structure.

2. The power driving chip according to claim 1, wherein when the inner temperature is lower than a re-driving temperature, the multi-level over-temperature protection circuit generates a re-driving signal to the controller, and the controller increases the output power of the integrated power module according to the re-driving signal.

3. The power driving chip according to claim 2, wherein the controller reduces at least one of a driving voltage and a driving current of the integrated power module according to the load-shedding driving signal, to decrease the output power of the integrated power module.

4. The power driving chip according to claim 2, wherein the controller reduces a duty cycle of a PWM driving signal of the integrated power module to decrease the output power of the integrated power module according to the load-shedding driving signal.

5. A power driving method, comprising:
disposing an integrated power module in a package structure, wherein the integrated power module comprises a transistor, and a gate driver electrically connected to the transistor;
disposing a controller in a package structure, and electrically connecting the controller to the integrated power module;
disposing a multi-level over-temperature protection circuit in a controller to measure an inner temperature of the controller;
setting a first trigger temperature of the multi-level over-temperature protection circuit, wherein when the inner temperature exceeds the first trigger temperature, the multi-level over-temperature protection circuit generates a load-shedding driving signal to the controller, and the controller decreases output power of the integrated power module according to the load-shedding driving signal; and
setting a second trigger temperature of the multi-level over-temperature protection circuit, wherein when the inner temperature exceeds the second trigger temperature, the multi-level over-temperature protection circuit generates an overloading driving signal to the controller, and the controller turns off the integrated power module according to the overloading driving signal;
wherein the second trigger temperature is higher than the first trigger temperature, and the second trigger temperature is a maximum withstand temperature of the integrated power module, and the first trigger temperature is a maximum withstand temperature of the controller, and the controller is stacked on the integrated power module in the package structure.

6. The power driving method according to claim 5, further comprising:
setting a re-driving temperature of the multi-level over-temperature protection circuit, wherein when the inner temperature is lower than the re-driving temperature, the multi-level over-temperature protection circuit generates a re-driving signal to the controller, and the controller increases the output power of the integrated power module according to the re-driving signal.

7. The power driving method according to claim 6, wherein the controller reduces at least one of a driving voltage and a driving current of the integrated power module according to the load-shedding driving signal, to decrease the output power of the integrated power module.

8. The power driving method according to claim 6, wherein the controller reduces a duty cycle of a PWM driving signal of the integrated power module according to the load-shedding driving signal, to decrease the output power of the integrated power module.

* * * * *